United States Patent [19]

Hoffmann

[11] 4,194,283

[45] Mar. 25, 1980

[54] PROCESS FOR THE PRODUCTION OF A SINGLE TRANSISTOR MEMORY CELL

[75] Inventor: Kurt Hoffmann, Taufkirchen, Fed. Rep. of Germany

[73] Assignee: Siemens Aktiengesellschaft, Berlin & Munich, Fed. Rep. of Germany

[21] Appl. No.: 934,263

[22] Filed: Aug. 16, 1978

[30] Foreign Application Priority Data

Aug. 17, 1977 [DE] Fed. Rep. of Germany ....... 2737073

[51] Int. Cl.² .......................................... H01L 21/22
[52] U.S. Cl. .................................... 29/571; 148/1.5; 148/187; 357/23; 357/55
[58] Field of Search .................. 148/187, 1.5; 357/55, 357/23; 29/571

[56] References Cited

U.S. PATENT DOCUMENTS

| 4,003,036 | 1/1977 | Jenne ................................ 357/55 X |
| 4,065,783 | 12/1977 | Ouyang .................................. 357/55 |
| 4,084,175 | 4/1978 | Ouyang .................................. 357/55 |
| 4,109,270 | 8/1978 | von Basse et al. ................. 357/55 X |
| 4,116,720 | 9/1978 | Vinson .............................. 148/187 X |

OTHER PUBLICATIONS

Altman, L., "Advances in Designs and New Processes Yield Surprising Performance," *Electronics,* Apr. 1, 1976, pp. 73-81.

*Primary Examiner*—G. Ozaki
*Attorney, Agent, or Firm*—Hill, Van Santen, Steadman, Chiara & Simpson

[57] ABSTRACT

In the production of V-MOS single transistor memory cells a simplification of the previous technology is disclosed wherein a process is utilized without epitaxial processes and with a minimum of doping processes. First the source and the drain zone of a field effect transistor forming a memory cell are produced and only then is a V-shaped recess formed at the site of these zones. In one embodiment, one re-doped zone is constructed as a flat zone and is produced on both sides adjacent to a second re-doped zone extending deeper into the silicon crystal. The V-shaped recess is then etched in such a way that the two zones are completely separated by the V-shaped recess. The silicon surface in the V-shaped recess is provided with a thin SiO₂ layer and with a gate electrode covering it. Advantageously the gate electrodes of neighboring V-MOS cells are united into a line. This occurs with one of the two zones of the transistor, whereas the other zone remains separate.

13 Claims, 14 Drawing Figures

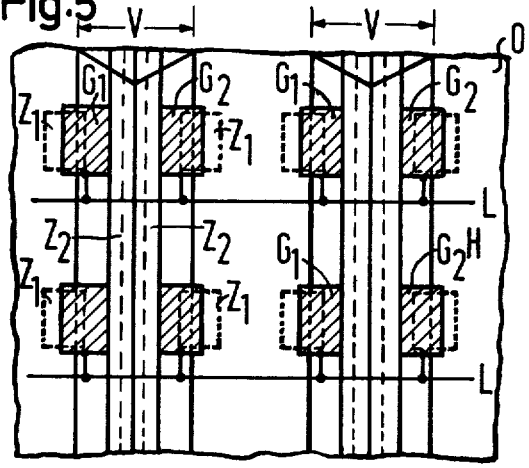
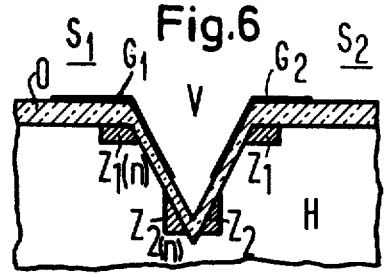
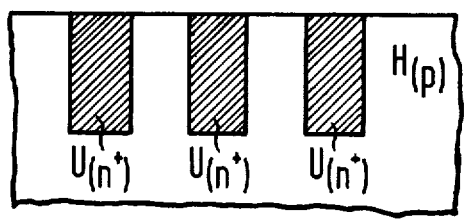
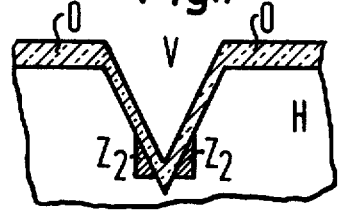
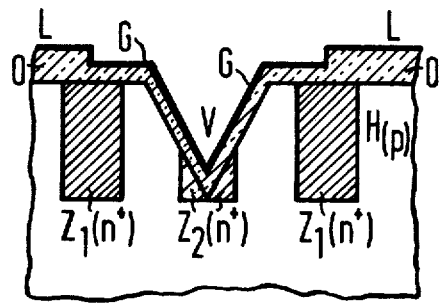
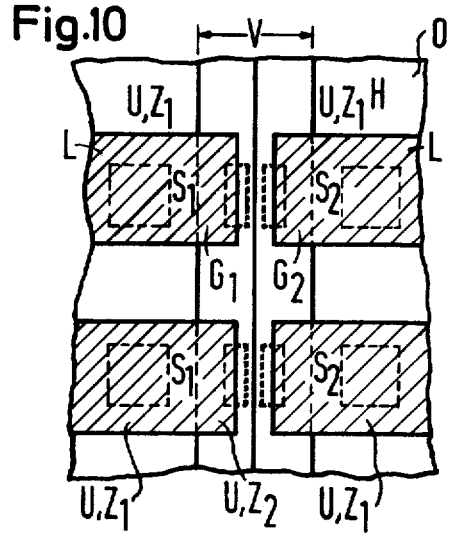
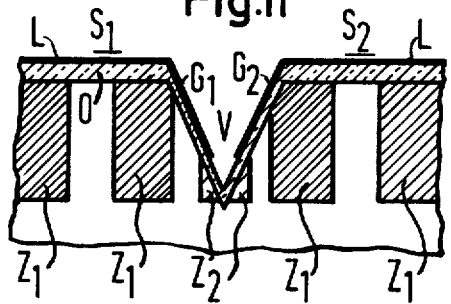

PROCESS FOR THE PRODUCTION OF A SINGLE TRANSISTOR MEMORY CELL

BACKGROUND OF THE INVENTION

The invention relates to a process for the production of a single transistor memory cell, in which in a semiconductor crystal of one conduction type, not only two zones of the opposite conduction type which are separated by a strip of the former type, but also a recess in the region of these two zones which is limited with plane surfaces converging toward the bottom are produced in such a way that the two zones within the recess reach the semiconductor surface. Also, the pn junctions of the two zones at the part of the semiconductor crystal having the original conduction type are configured differently so that the capacity of the memory cell to be produced is at least predominantly represented by only one of the two pn junctions. Finally, an insulating layer is provided within the recess and a gate electrode is provided thereon capacitively controlling the two pn junctions.

As is known, a process of this kind leads to a so-called V-MOS transistor, such as is described, for example, in the publication "Electronics" (Apr. 1, 1976), Pages 77 and 78 and incorporated herein by reference. In order to produce the transistor, the starting point is an n+-doped disk-shaped silicon monocrystal on whose surface a p-doped monocrystalline silicon layer is epitaxially deposited. The surface of the epitaxial layer is then provided with a diffusion mask with the aid of which an n+ conductive zone is then produced by diffusion. This forms the drain zone; the substrate forms the source zone, and the non-re-doped intermediate layer between the two zones forms the channel-forming zone of the field effect transistor of the memory cell. For completion, a recess with a V-shaped longitudinal profile is produced in the region of the drain zone using an etching mask. The lowest point of the profile extends into the n+ doped substrate. The semiconductor surface in the recess is then covered with a thin oxide layer on which the gate electrode of the field effect transistor is then applied. The designation "V-MOS" results from the V-shaped recess.

In order to now develop a V-MOS transistor of this kind into a single transistor memory cell, one of the two zones of the opposite conduction type, for example, the source zone, is for example usually given a stronger doping than the other of these two zones, for example, the drain zone. In addition, this source zone is individually assigned to the individual memory cell in an integrated memory matrix constructed of such memory cells, while the drain zone is frequently also employed to serve as a bit line in connection to further memory cells arranged within the same matrix column as the cell in question. In order to produce an arrangement of this kind, the starting point is a p conductive substrate on whose surface an n+ doped source zone along the lines of a buried layer is produced on its surface. A p doped semiconductor layer is then epitaxially deposited on the substrate provided with the source zone or zones, respectively, and in this semiconductor layer the drain zones, the V-shaped recesses and the gate electrodes of the individual field effect transistors are produced.

Obviously an advantage of the V-MOS technique in supplying these memory cells lies in the fact that integrated semiconductor memories with especially high cell density can be produced. However, the usual production processes operate with epitaxial layers.

SUMMARY OF THE INVENTION

It is an object of the invention to eliminate the use of epitaxial layers.

It is preferable that first the two zones of the opposite conduction type be produced on the plane portion of the surface of the semiconductor crystal and only then that the recess with the gate electrode be produced.

Thus, in contrast to the usual technique, the starting point is a semiconductor crystal whose material forms, without further redoping, the channel-forming zone of the field effect transistor of the memory cell, while not only the source zone but also the drain zone are produced by local re-doping. The production of the depression in the semiconductor surface is then produced in such a way that both redoped zones reach the semiconductor surface in the region of the depression in order to permit an effective capacitive control of both zones by a gate electrode applied within the depression. In this way epitaxial techniques are dispensed with.

The various ways of carrying out the inventive process will now be described more specifically with the aid of FIGS. 1 to 14. FIGS. 1 to 7 serve for describing a first way of carrying out the inventive process, while a second way of carrying it out will be explained by means of FIGS. 8 to 14.

A first way of carrying out the invention consists in that on a plane surface portion of the semiconductor crystal, an area A is brought into contact with a dopant producing the opposite conduction type to that of the semiconductor crystal. The dopant effectuates at that point to a depth T a re-doping of the semiconductor crystal and the formation of a re-doped region $U_1$ corresponding to the shape and size of area A. In addition a second area B adjacent to area A at the outside is brought into contact with a dopant producing the opposite conduction type to that of the semiconductor crystal in such a way that the dopant effectuates at that point to a depth t a re-doping of the semiconductor crystal and the formation of a re-doped region $U_2$ determined by the shape and the size of area B. In the process, the depth t is dimensioned smaller than depth T. Finally, the recess V is produced at areas A and B of the semiconductor surface in such a way that at least two separate zones $Z_2$ and $Z_1$ are formed from the re-doped regions $U_1$ and $U_2$, of which one reaches the semiconductor surface in the recess along the edge thereof and the other reaches it at its lowest point. In the process, for example, areas A and B on the semiconductor surface will be expediently selected in such a way that area A has the shape of a rectangle and area B the shape of an adjoining strip. The depression V receives the shape of an inverted square pyramid or funnel, the edge of which encloses the area A within area B.

This form of the inventive process is expediently employed if either an individual memory cell is to be produced, or if, in the production of an integrated matrix of such memory cells, the connection between adjacent cells of the matrix is carried out by exterior means. This is represented by means of FIGS. 1 and 3.

A second form of the first process of the invention provides that area A receives the shape of an elongated rectangular strip and that in each case two areas B which belong together are provided in such a way that both areas B can be represented one on the other by means of mirroring on the longitudinal symmetrical axis of area A, and each area B receives a common boundary to area A. Finally, the recess receives the shape of an inverted roof whose length is at least equal to the length of area A and whose two edges are aligned parallel to the boundary of area A through each one of the two areas B.

In a third form of the first process of the invention it is provided that area A receives the shape of an elongated rectangular strip and that furthermore, in each case, two areas B which belong together are provided in such a way that the two areas B can be represented one upon the other by means of mirroring on the longitudinal symmetrical axis of area A, and each area B receives a common boundary to area A, and that, finally, for each pair of areas B which belong together, one recess is provided for each having the shape of an inverted square pyramid. It is produced in such a way that the recess with the edge running parallel and perpendicular to the boundary of area A is embodied symmetrically to the plane which is perpendicular to the semiconductor surface through the longitudinal symmetrical axis of area A.

These two variations of the process are primarily employed when the production of a memory matrix is involved and one of the two zones of the single transistor memory cells is to be simultaneously developed as a bit line. The two embodiments are described more specifically with the aid of FIGS. 2 to 7.

BRIEF DESCRIPTION OF THE DRAWINGS

FIGS. 1 through 7 illustrate a first basic process of the invention for the production of single transistor memory cells; and FIGS. 8 through 14 illustrate another basic embodiment of the process of the invention.

DESCRIPTION OF THE PREFERRED EMBODIMENTS

Figure 1:
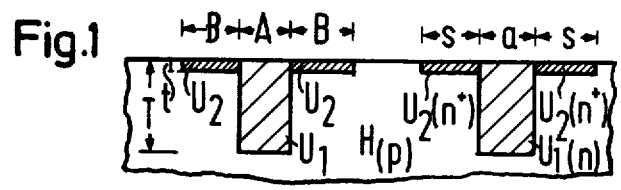

According to FIG. 1, paired re-doped zones $U_1$, $U_2$ of the opposite conduction type are produced on one surface side of a p conductive silicon monocrystal H by means of diffusion or, respectively, implantation of donor material. Then, as a consequence of the production of a recess V in the shape of an inverted pyramid, i.e., standing on its apex with square cross section, each pair of re-doped zones $U_1$, $U_2$ is reformed into two separate zones $Z_2$ and $Z_1$, respectively, one of which, namely, $Z_1$, forms the source zone and simultaneously the memory capacity of the cell, while the other zone $Z_2$ represents the drain zone. In accordance with the above general remarks, two concentric squares on the plane semiconductor surface are limited, for this purpose, with sides oriented parallel to each other for each memory cell to be produced. The inside of these two squares represents area A. The difference between the inner and the outer square represents area B. By definition, the re-doped zone $U_1$ extending to a greater depth T is created by the re-doping occurring exclusively over area A, and the re-doped zone $U_2$ extending only to a smaller depth is created by the re-doping occurring exclusively over area B. Preferably, the one of the two re-doped zones extending only to the lesser depth t, namely, zone $U_2$, receives the higher doping concentration. It is thus n+ doped in comparison to the other zone $U_1$, so that the pn junction limiting it receives a greater steepness and thus a higher specific capacity than the pn junction limiting zone $U_1$. Additionally, since area B is selected larger than area A, it is automatically provided that the pn junction limiting the re-doped zone $U_2$ and capacitance zone $Z_1$ receives a noticeably greater capacitance than the latter, second re-doped zone of the memory cell $Z_2$ which represents particularly the drain of the memory cell.

Figure 3:
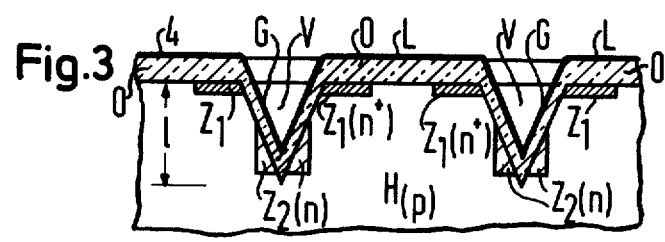

The diffusion or implantation mask to be used for the doping of zone $U_1$ must evidently be configured in such a way that it covers the semiconductor surface with the exception of area of areas A, so that the donor to be offered can only there penetrate into the semiconductor crystal. The situation is different with the mask to be used for the doping of the zone $U_2$. This one can be configured in such a way that it leaves only areas B exposed. It can, however, also be configured in such a way that it leaves areas A and B exposed. Then, to be sure, during the production of zone $U_2$ and during the production of zone $U_1$, dopant penetrates into a zone extending to a depth t beneath the surface region A, so that these are doped more strongly than the zone $U_2$ assigned exclusively to area B, and by all means more strongly than the portions of zone $U_1$ having a greater depth than t. This especially strongly doped region directly under the semiconductor surface of area A is automatically removed, however, during the production of the recess as can be recognized directed from FIG. 3.

For the production of recesses with converging plane limiting surfaces, use is made, for example, of the fact that the etching speed in a silicon monocrystal is directionally dependent in such a way that the removal speed is smallest perpendicular to the (111) planes. For this reason, with the use of correspondingly coordinated etching agents, depressions can be spontaneously produced whose four limiting surfaces belong to one each of the four groups of (111) planes of the crystal lattice. Accordingly, two such limiting surfaces each meet at an angle whose cosine has the value one-third (somewhat more than 70°).

It is therefore expedient if the etching masks to be used for producing the recesses V are aligned on a crystal surface section not coinciding with a (111) plane in such a way that the boundaries of the etching windows are parallel to each group of (111) planes. Since, on the other hand, the orientation and arrangement of the windows, as follows from the Figures for this application, is to be selected in a specific arrangement with regard to the two re-doped zones $U_1$ and $U_2$, in order to obtain the capacitance zone $Z_1$ and the other zone $Z_2$ of the individual memory cells from the two zones $U_1$ and $U_2$, it is recommended that the boundaries of the re-doped zones $U_1$ and $U_2$ (and thus those of areas A and B) are established in such a way that they run parallel to the lines of intersection of the four groups of (111) planes on the selected plane semiconductor surface. On the basis of the above remarks, the same is true for orientation and limiting windows in the etching mask to be used for etching the recesses V.

It is possible, for example, to use, as an etching mask, an $SiO_2$ layer or metal layer provided with square or rectangular etching windows on the basis of a photolacquer etching technique wherein this layer has been applied, for example, by sputtering on the selected plane semiconductor surface. A surface falling together with a (100) plane of the silicon lattice is especially expediently used as the plane surface section to be subjected to the inventive process. Diluted alkali solution, for example, KOH, serves, for example, as the etching agent. If d is then the width of the window in the etching mask used for etching the recess V, then the depth l of the pyramid or, respectively, trench-shaped recess is determined by the relationship $$l = d \cdot \sqrt{2}$$

If s is now the width of area B and a the width of area A measured along the dimension given with FIG. 1, then, for the width d of the depression V on the semiconductor surface, the relationship $$(s + a/2) > d/2 > a/2$$

must be adhered to. Furthermore, d/2 must not be smaller than $a + t/2$, with t being the depth of the re-doped region $U_2$ formed beneath area B.

Figure 2:
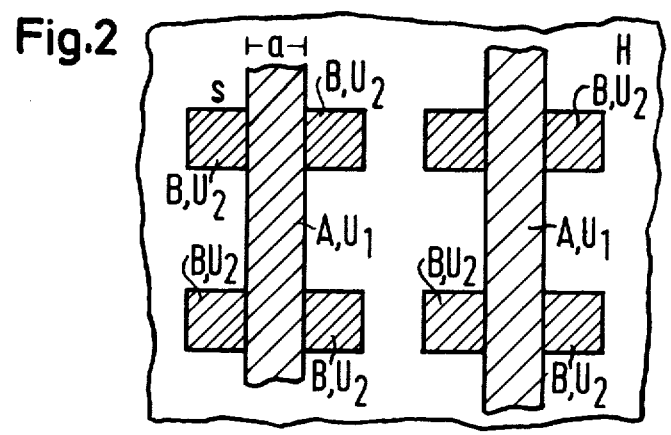

In FIG. 1 the allocation of the two re-doped zones $U_1$ and $U_2$ is shown with zone $U_1$ receiving a significantly lesser donor concentration than the zone $U_2$ produced over area B. FIG. 2 shows the way in which the depression V is to be produced in relation to the two zones $U_1$ and $U_2$ in order to obtain a separation of the two zones $U_1$ and $U_2$ into two separate zones $Z_2$ and $Z_1$, respectively. For zones $U_1$ and $U_2$ and for the depression V, the square configuration is initially assumed in each case. If the depth l of the depression V is selected in such a way that it becomes greater than the depth T of the re-doped zone $U_1$, then one sees immediately that for geometrical reasons the condition $l < (T + a \cdot \sqrt{2})$ must be adhered to so that a formation of a zone $Z_2$ from the re-doped zone $U_1$ does not come about during the production of the depression V. It is to be noted that the above noted geometric observations proceed from the case in which the redoped zones $U_1$ and $U_2$ and the depression V are produced on a (100) oriented silicon surface. In the example illustrated in FIG. 2, the condition $$(T + a/2) > l > T$$

is adhered to for the depth l of V.

To complete the arrangement, the semiconductor surface must be coated with an insulating layer which must be thick outside the recesses V but thin inside the recesses. This is achieved, for example, if for the etching of the depressions V an etching mask consisting of $SiO_2$ is used which then remains on the semiconductor surface and forms the foundation of the thick portions of the insulating layer. After the production of the depressions V the entire surface of the arrangement obtained is then exposed to conditions at which a thin $SiO_2$ layer forms in the depressions V and the already present portions of the $SiO_2$ layer are augmented. The insulating layer is designated in the Figures with 0. Finally, the insulating layer 0 in the depressions is provided with one gate electrode G each. As in the case of the sample embodiments this gate electrode can be a constituent part of a conductor path L which effectuates the connection between the memory cells of a matrix line.

Figure 4:
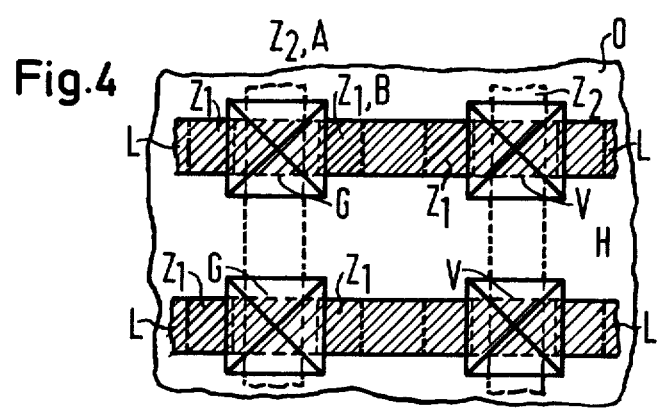

In the mode of operation to be seen in FIG. 2 the area B is subdivided into two partial areas B which are respectively arranged on both sides of the strip-shaped areas A. This already above described way of arranging the areas A and B corresponds to the other two above-mentioned variations of the first embodiment form of the inventive process. Both variations do not differ in the configuration of the two areas A and B and thus of the two re-doped zones $U_1$ and $U_2$, but rather solely in the fact that, in one case, the depressions V receive the shape of inverted pyramids, and in the other case the shape of a symmetrically inverted roof. The first case is represented with the aid of FIG. 4; the second with the aid of FIGS. 5 to 7. FIGS. 4 and 5 each present a top view. For the case of the use of trench-shaped depressions V only the following possibility is of significance, which is explained with the aid of FIGS. 5, 6 and 7.

If the depth l of the recess V having the shape of an inverted symmetrical roof is to be arranged symmetrically to the area A having the shape of a rectangular strip, the depth l is selected in such a way that it is greater than the depth of the re-doped zone $U_1$, and then two zones $Z_2$, i.e., two bit lines, are formed simultaneously from the re-doped zone $U_1$. This possibility is expediently employed if it is desired to minimize the memory capacity of the two zones $Z_2$ of the individual memory cells in comparison to the capacity of the other zone $Z_1$.

Then, as FIG. 6 shows in section, two gate electrodes $G_1$ and $G_2$ each will also be provided. These gate electrodes are then arranged with one each of the two boundary or limiting surfaces of the trench-shaped depression V in order to capacitively bridge the intermediate space between the respective zone $Z_2$ and the capacity zones $Z_1$ which have been formed out of each of the two re-doped zones $U_2$. In contrast to the arrangement represented in FIG. 4, one thus has two field effect transistors per depression, i.e., two single-transistor memory cells $S_1$ and $S_2$. These can then be grouped together line-wise by means of corresponding word lines L which are applied on the insulating layer away from zones $Z_1$. (For this purpose the oxide layer 0 will be dimensioned thin in the trenches V where the capacity zones $Z_1$ reach semiconductor surface in the trenches V. On the other hand, away from these sites it is adjusted so as to be thick in the trenches V in order to achieve a sufficient capacitive decoupling between the word lines L to be run there and the bit lines represented by zones $Z_2$.)

If on the other hand, in the configuration of areas A and B seen in FIG. 2, recesses V are used which have the shape of an inverted pyramid, and from each of the re-doped zones $U_1$ only a single bit line and, per recess, one memory cell each is formed. The memory cells have two capacity zones, however, which are separate from each other and which respectively represent half the memory capacity of the memory cell.

FIG. 7 represents a section run perpendicularly to the bit lines $Z_2$ in the arrangement represented in FIG. 5 away from the capacity zones $Z_1$, whereas the section represented in FIG. 6 is run through the capacity zones on both sides of the two bit lines $Z_2$.

It must be additionally noted in conclusion that in the embodiment of the inventive process leading to the splitting up of the two re-doped zones $U_1$ and $U_2$ by a trench-shaped depression V, an especially high bit density of a V-MOS memory produced on the basis of the inventive process is obtained.

In a second embodiment form of the inventive process which is now to be discussed, on a plane portion of the surface of a p or n conductive semiconductor crystal H, two re-doped discrete zones U having the opposite conduction type to that of the semiconductor crystal H are produced and then the depression V in the region of one of these two zones U is produced in such a way that the original semiconductor surface is removed in the region of this one zone U, and the removal extends at least into the immediate vicinity of the other zone U. On the other hand, as a result of the placement of the depression V, the capacity of the pn junction of the one of the two re-doped zones U subjected to the heavier removal in the production of the recess V is strongly reduced with respect to the capacity of the pn junction of the other re-doped zone U.

As can be seen from FIGS. 8, 9 and 10, the process is expediently carried out such that in a joint doping process to be carried out using a correspondingly formed doping mask, three identical zones U with square or rectangular cross-section are produced with n+ doping on a surface section coinciding with a (100) plane, said surface section being of a p-conductive disk-shaped silicon crystal H. The production occurs such that the three zones lie in a row and the two outer zones each have the same distance from the middle zone. A trench-shaped recess V is then produced symmetrically to the symmetry plane of the arrangement of the one outer zone in relation to the second outer zone. This symmetry plane passes through the center of the middle zone of the three zones. In this way the aperture width d of the depression V becomes greater than the width (measured in the same direction as d) of the middle zone of the three re-doped zones U. In particular, the aperture width d is at least equal to the sum of the width of the middle zone U and of double the spacing of two adjacent zones U.

In this way the relationships illustrated in FIGS. 8 to 11 are obtained. If the depth l of the trench V is selected larger than the depth of the three re-doped zones U, it results that the middle zone H is subdivided into two separate regions. However, just as in the case of FIGS. 5 to 7, it is a prerequisite that the length of the trench-shaped recess is dimensioned greater than the length of the zone U to be separated.

It is also recommended when carrying out the inventive process as described with the aid of FIGS. 8 to 11, that, because of their larger pn junction, the remainder zones formed out of the two exterior zones of the three zones U are used as capacity zones $C_1$, and the zone or zones remaining from the middle zone of these zones, after deducting the recess, are used as bit lines in the application of the process to the production of a memory matrix. If, as a consequence of a correspondingly great depth l of the trench-shaped recess V, two bit lines have been obtained from the middle zone, then, as represented in FIG. 6, one or two gate electrodes per recess can in turn be used. Therefore, in the first case, two memory cells controlled by a common word line (gate electrode) are achieved and in the second case two completely decoupled memory cells result. The first case is represented in FIG. 9; the second in FIGS. 10 and 11.

By means of doping techniques now it is now possible to increase the capacity of zone $Z_1$ represented in the memory capacity of the individual memory cell. Starting from an arrangement of the three zones in accordance with FIG. 8, by means of masked diffusion or, respectively, implantation, a partial region of each of the two outer zones of these zones U is re-doped without extending to depth T of these zones and not encompassing the entire surface of the zone involved. This requires an extension of the pn junction bordering the zone involved, and thus an increase in the memory capacity of the memory cell containing the zone $Z_1$ obtained by the partial re-doping.

Figure 12:
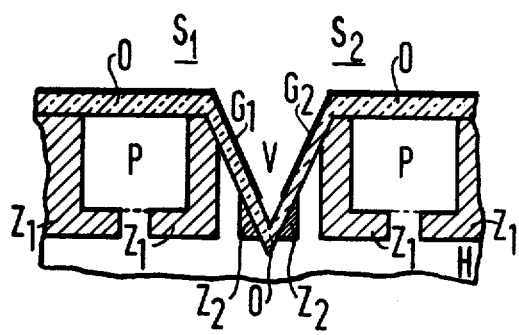

In accordance with the mode of operation to be seen from FIG. 12, the three re-doped zones U are first produced with rectangular or square cross section. Since, as a rule, when the production of a memory matrix is involved, such zone U triplets will be produced respectively at the intersections of the matrix to be produced (i.e., at the points of intersection of the individual lines with the individual columns), and the orientation of the arrangement of the three zones will be aligned in the direction of the matrix line concerned. Then, between each two adjacent triplets of zones U, one p+ doped zone P each covering one portion of the mutually facing outer zones of the two triplets but not extending to the depth of these two zones, will be produced using a new doping mask. Finally, the trench-shaped recess with a V-shaped sectional profile will be produced at the location of the middle zone of the three zones U, as has already been set forth with the aid of FIGS. 8 and 9. The memory arrangement provided with the outside layer O and with respectively two gate electrodes $G_1$ and $G_2$ arranged opposite each other in the recess V is represented in cutaway section in FIG. 11. Thus, two memory cells $S_1$ and $S_2$ per depression are in turn obtained if care is taken that the depth l of the trench-shaped depression V is adjusted so as to be greater than the depth of the re-doped zones U. Hence the middle re-doped zone is in turn subdivided by the depression into two zones $Z_2$ usable as bit lines. The two capacity zones $Z_1$ formed from the two outer zones U have an L-profile illustrated in FIG. 12.

Figure 13:
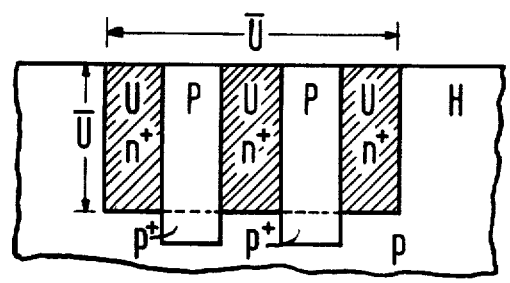
Figure 14:
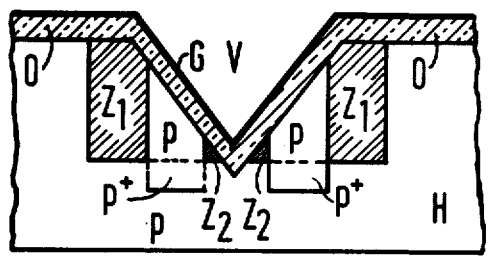

A further possibility of increasing the capacity of the memory cells is set forth with the aid of FIG. 13. Here as well the goal is to produce three zones arranged next to one another in a row on the semiconductor surface, with a type of conduction which is opposite to that of the semiconductor crystal. Accordingly, in a first working step, by means of corresponding masked technique by implantation or, respectively, diffusion, a block-shaped n+ zone $\overline{U}$ is produced in the p conductive semiconductor crystal H, said zone covering the area of the three n+ zones U of FIG. 8, including the intermediate spaces between these zones. Then, by means of a second doping mask and diffusion or, respectively, implantation, the area of the intermediate spaces is transformed into p doped material, so that three separate zones U with n+ doping are formed out of the zone $\overline{U}$. In order to achieve a total separation of the three zones U, the p type zones P produced between them must be driven down to a greater depth than the original zones $\overline{U}$. The overlapping with the area of the semiconductor crystal H having the original doping then leads to the formation of p+ islands, which are, to be sure, indicated in the Figure, but which have no significance for the finished switching cell. The further processing leads to the completed switching cells which can, for example, be embodied according to FIG. 14.

The sample embodiments are selected in such a way that the capacity zones $Z_1$ and the bit line zones $Z_2$ of the memory cells are of n type. The substrate H on the other hand is of p type. The reverse case is also possible. However, memories of that kind are somewhat slower.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A method for producing a single transistor memory cell comprising the steps of:
   (a) providing a semiconductor body of first conductivity type having a major surface;
   (b) doping the body at a first area on the major surface to create a first zone extending from the major surface to a given depth and of second conductivity type opposite to the first conductivity type;
   (c) doping the body at a second area on the major surface and adjacent to the first to create a second zone extending from the major surface and of substantially lesser depth and of second conductivity type and a substantially higher conductivity than the first zone so that a pn junction at the second zone and the semiconductor body has a higher capacity than a pn junction at the first zone;
   (d) after doping at the first and second areas then producing a recess in the first zone from the major surface, said recess laterally extending at the major surface beyond the first zone to the second zone and becoming narrower below the major surface such that the first zone reaches a surface of the semiconductor body within the recess and at a level below where the second zone also reaches a surface of the recess; and
   (e) providing an insulated gate electrode in the recess.

2. A method according to claim 1, including the further steps of providing the first area with a given width; providing the second area in the shape of a rectangle alongside the first area; and providing the recess with the shape of an inverted square pyramid which is wider than the width of the first area.

3. A method according to claim 1 including the further steps of providing the first area with the shape of a rectangular strip; providing two of said second areas which are mirror images of each other with respect to a longitudinal symmetrical axis of the first area, and that each of the two second areas is adjacent the first area, and providing the recess with the shape of an inverted roof whose length is at least equal to a length of the first area and whose two edges run through each of the two second areas and are parallel to boundaries of the first area.

4. A method according to claim 3 comprising the further step of providing the second areas as rectangles.

5. A method according to claim 1 including the further steps of providing the first area in the shape of a rectangular strip; providing two of said second areas which are mirror images of one another with respect to a longitudinal symmetry axis of the first area, each second area having a common border with the first area; and providing the recess with a shape of an inverted pyramid.

6. A method according to claim 1 comprising the further step of selecting a depth of the recess greater than the given depth of the first zone beneath the first area.

7. A method according to claim 1 comprising the further steps of producing a plurality of single transistor memory cells on the major surface of the semiconductor body in the form of a memory matrix, and that the first zone having the pn junction of smaller capacity is combined with a similar zone of at least one further memory cell as a continuous zone which simultaneously forms an electrical connection to this memory cell.

8. A method according to claim 1 including the step of splitting up the first zone by the recess into two subzones, providing one of said second zones on each side of the first zone, and applying one gate electrode within the recess for each pair of zones.

9. A method for producing a single transistor memory cell, comprising the steps of:
   (a) providing a semiconductor body of first conductivity type having a major surface;
   (b) doping the body within at least first and second spaced apart areas on the major surface to create first and second spaced apart doped zones of second conductivity type opposite to the first conductivity type extending from the major surface into the semiconductor body;
   (c) after doping at the first and second areas producing a recess from the major surface into the first zone, said recess on the major surface extending beyond the first zone and narrowing below the major surface such that in providing said recess substantial portions of said first zone are removed such that a capacitance of a pn junction at the first zone relative to the semiconductor body is less than a capacitance of a pn junction at the second zone, said first zone reaching the semiconductor surface in said recess and at a level below where the second zone reaches the semiconductor surface; and
   (d) providing an insulated gate electrode in the recess.

10. A method according to claim 9 comprising the further steps of producing in a common doping process three substantially identical zones of rectangular cross section and a conduction type opposite to that of the semiconductor body, the three zones lying in a row with substantially equal spacing; and producing the recess on a surface of a middle one of the three zones symmetrically with respect to a symmetry plane between the other two zones, said symmetry plane passing through a center of the middle zone, said recess having an aperture width greater than a width of the middle zone.

11. A method according to claim 10 including the further step of providing the aperture width of the recess at least equal to a sum of the width of the middle zone and double a spacing between the middle zone and one of the outer zones.

12. A method according to claim 9 including the further step of producing the maximum depth of the recess greater than a depth of the first zone.

13. The method of claim 9 wherein the first and second spaced apart doped zones are created by initially doping a single large zone of second conductivity type and then separating the large zone into the first and second zones by doping a separating zone of first conductivity type into the large zone.

* * * * *